US006411176B1

(12) United States Patent
Atokawa et al.

(10) Patent No.: US 6,411,176 B1
(45) Date of Patent: Jun. 25, 2002

(54) VOLTAGE-CONTROLLED DUPLEXER AND COMMUNICATION APPARATUS

(75) Inventors: Masayuki Atokawa, Kanazawa; Kikuo Tsunoda, Mishima-gun, both of (JP)

(73) Assignee: Murata Manufacturing Co., Ltd. (JP)

( * ) Notice: Subject to any disclaimer, the term of this patent is extended or adjusted under 35 U.S.C. 154(b) by 58 days.

(21) Appl. No.: 09/587,505

(22) Filed: Jun. 5, 2000

(30) Foreign Application Priority Data

Jun. 3, 1999 (JP) .......................................... 11-157108

(51) Int. Cl.[7] .................................................. H03H 7/46
(52) U.S. Cl. ........................ 333/132; 333/134; 333/206
(58) Field of Search ................................ 333/132, 134, 333/206, 207

(56) References Cited

U.S. PATENT DOCUMENTS

| | | | | |
|---|---|---|---|---|
| 4,097,826 A | | 6/1978 | Knox et al. | 333/73 |
| 5,594,394 A | * | 1/1997 | Sasaki et al. | 333/103 |
| 6,085,071 A | * | 7/2000 | Yamada et al. | 455/82 |

FOREIGN PATENT DOCUMENTS

| | | |
|---|---|---|
| EP | 0881700 A1 | 12/1998 |
| EP | 0910132 A2 | 4/1999 |
| JP | 57166701 | 10/1982 |
| JP | 63009303 | 1/1988 |
| JP | 645808 | 2/1994 |

* cited by examiner

*Primary Examiner*—Justin P. Bettendorf
*Assistant Examiner*—Joseph Chang
(74) *Attorney, Agent, or Firm*—Ostrolenk, Faber, Gerb & Soffen LLP

(57) ABSTRACT

There is disclosed a duplexer comprising: a first external terminal; a second external terminal; an antenna terminal; a first frequency variable filter electrically connected between the first external terminal and the antenna terminal, and composed of at least one resonator and a reactance element electrically connected to the resonator and capable of being voltage-controlled; a second frequency variable filter electrically connected between the second external terminal and the antenna terminal, and composed of at least one resonator and a reactance element electrically connected to the resonator and capable of being voltage-controlled; the predetermined reactance element of the first frequency variable filter being in the on state when the reactance element of the second frequency variable filter is in the on state.

8 Claims, 9 Drawing Sheets

VOLTAGE-CONTROLLED DUPLEXER AND COMMUNICATION APPARATUS

BACKGROUND OF THE INVENTION

1. Field of the Invention

The present invention relates to a duplexer for use in a microwave band, for example, and a communication apparatus.

2. Description of the Related Art

A transmission frequency band required for the transmission side circuit of a duplexer for use in PCS is 1850–1910 MHz, and a reception frequency band for a reception side circuit is 1930–1990 MHz. It is necessary for both of the transmission side circuit and reception side circuit to have a wide pass-band of 60 MHz. On the other hand, the separation assured to separate the transmission frequency band from the reception frequency band is 20 MHz. That is, the separation between the both bands is very narrow.

Further, the duplexer composes the phase of the transmission side circuit and that of the reception side circuit. In the case of PCS, the phase of the transmission side circuit and that of the reception side circuit are ideally composed by setting the transmission side circuit to have a high impedance (open) in the reception frequency band of 1930–1990 MHz, and setting the reception side circuit to have a high impedance (open) in the transmission frequency band of 1850–1910 MHz.

FIG. 8 shows an example of the circuit configuration of a prior art duplexer 1. In the case of a PCS system, the separation between the transmission frequency band and reception frequency band is narrow, namely, 20 MHz. Accordingly, the transmission frequency band is divided into two ranges of 1850–1880 MHz and 1880–1910 MHz, and also, the reception frequency band is divided into two ranges of 1930–1960 MHz and 1960–1990 MHz. That is, the frequency bands become narrow, and the separations are wide. In particular, reactance elements (PIN diode) are connected to resonators, respectively, and control the voltages of the resonators, so that the two types of pass-bands of each of the transmission side circuit 25 and the reception side circuit 26 can be changed over, resulting in reduction of the number of the filter stages. Like this, it is attempted to downsize the duplexer and give high qualities thereto. In FIG. 8, a transmission terminal is designated by Tx, a reception terminal by Rx, an antenna terminal by ANT, resonators in the transmission side circuit 25 by 2 and 3, resonators in the reception side circuit 26 by 4 to 6, coupling coils by L1 and L11, coupling capacitors for determining a rejection-band attenuation by C1 and C2, capacitors by C5, C6, and C24, frequency band variable capacitors by C3, C4, and C7 to 9, PIN diodes by D2 to D6, choke coils by L2, L3, and L6 to 8, control voltage supply resistances and capacitors by R1 and R2, and C22 and C23, respectively, coils and capacitors constituting phase circuits by L20 and L21, and C15, respectively, and coupling capacitors by C11 to C14.

CONT1 designates a voltage control terminal for controlling the voltages of the PIN diodes D2 and D3 of the transmission circuit 25, and CONT2 a voltage control terminal for controlling the voltages of the PIN diodes D4 to D6. When positive voltages are applied to the voltage control terminals CONT1 and CONT2, the PIN diodes D2 to D6 are in the on state, and the duplexer 1 operates through the LOW channel. That is, as shown in FIG. 9, the pass-band of the transmission side circuit 25 becomes 1850–1880 MHz, and that of the reception side circuit 26 becomes 1930–1960 MHz. To the contrary, when the control voltages are zero with no voltages being applied to the voltage control terminals CONT1 and CONT2, the PIN diodes D2 to D6 turn off, and the duplexer 1 operates through the HIGH channel. That is, as shown in FIG. 9, the pass-band of the transmission side circuit 25 becomes 1880–1910 MHz, and that of the reception side circuit 26 becomes 1960–1990 MHz.

A portable telephone is put on standby for a reception wave except the time when speech is carried out. In case the frequency during the reception wave standby is 1930 MHz and the reception wave standby is carried out with positive voltages being applied to the voltage control terminals CONT1 and CONT2, the battery of the portable telephone is quickly exhausted, which causes the problem that the reception wave standby time becomes short.

It may be supposed that as countermeasures against the problem, the control voltage of the voltage control terminal CONT1 is set at 0V and a positive voltage is applied to the voltage control terminal CONT2 only. Since a consumption current flows through only the reception side circuit 26 during the reception wave standby, the exhaustion of the battery can be suppressed. However, as to a system such as PCS in which the frequency of the transmission frequency band is lower than that of the reception frequency band, the separation between the pass-band (1880–1910 MHz) of the transmission side circuit 25 and that (1930–1960 MHz) of the reception side circuit 26 is very narrow, as shown in FIG. 10, when the PIN diodes D2 and D3 in the transmission side circuit 25 is turned off (in the off state) and the PIN diodes D4 to D6 in the reception side circuit 26 is turned on (in the on state). Therefore, it is difficult to set the transmission side circuit 25 to have a high impedance (open) in the reception frequency band of 1930–1960 MHz. Thus, there arises the in problem that the insertion loss of the reception side circuit 26 is large.

FIG. 11 is a graph showing the measurement results of the band-pass characteristic S32 and reflection characteristic S22 (see FIG. 8) of the reception side circuit 26 obtained when positive voltages are applied to the voltage control terminals CONT1 and CONT 2. In this case, the insertion loss of the reception side circuit 26 was 3.3 dB. On the other hand, FIG. 12 is a graph showing the measurement results of the band-pass characteristic S32 and reflection characteristic S22 of the reception side circuit 26 obtained when a positive voltage is applied to the voltage control terminal CONT 2 only. In FIG. 12, the waveform is distorted in the part thereof shown by a circle A. In this case, the insertion loss of the reception side circuit 26 was deteriorated to be 5.0 dB.

SUMMARY OF THE INVENTION

To overcome the above described problems, preferred embodiments of the present invention provide a duplexer of which the consumption current is small and the insertion loss is low, and a communication apparatus.

One preferred embodiment of the present invention provides A duplexer comprising: a first external terminal; a second external terminal; an antenna terminal; a first frequency variable filter electrically connected between the first external terminal and the antenna terminal, and composed of at least one resonator and a reactance element electrically connected to the resonator and capable of being voltage-controlled; a second frequency variable filter electrically connected between the second external terminal and the antenna terminal, and composed of at least one resonator and a reactance element electrically connected to the resonator and capable of being voltage-controlled; the predetermined reactance element of the first frequency variable filter being in the on state when the reactance element of the second frequency variable filter is in the on state.

Hereupon, the first frequency variable filter is a transmission filter, for example, and the second frequency variable filter is a reception filter, for example. As the reactance elements, for example, PIN diodes and variable capacitance diodes are used.

When the reactance element of the second frequency variable filter is in the on state, the predetermined reactance element of the first frequency variable filter is in the on state. Thereby, the impedance of the first frequency variable filter is enhanced in the resonant frequency band of the second frequency variable filter. Accordingly, the insertion loss of the second frequency variable filter is suppressed. In addition, since only the predetermined reactance element of the first frequency variable filter is in the on state, the current consumption is reduced as compared with the case where all the reactance elements of the first frequency variable filter are in the on state. Thus, the power consumption during reception wave standby is decreased.

Another preferred embodiment of the present invention provides a communication apparatus including any one of the duplexers described above. Accordingly, the power consumption during reception wave standby is suppressed, and the loss of the reception side circuit is reduced.

Other features and advantages of the present invention will become apparent from the following description of the invention which refers to the accompanying drawings.

DESCRIPTION OF THE PREFERRED EMBODIMENTS

First Embodiment, FIGS. 1 to 4

Figure 1:
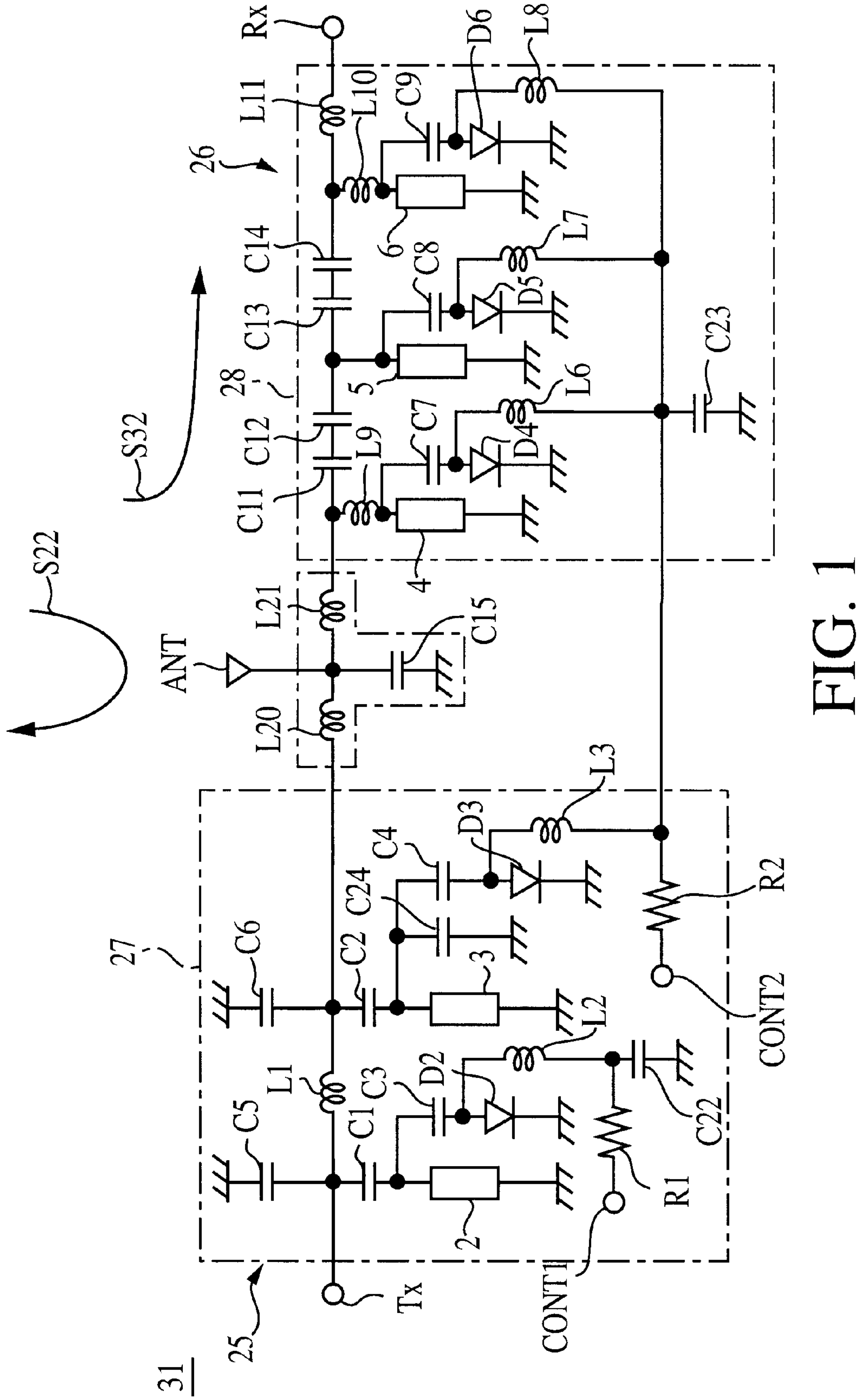
FIG. 1 is an electric circuit diagram according to a first embodiment of the duplexer of the present invention.
Figure 2:
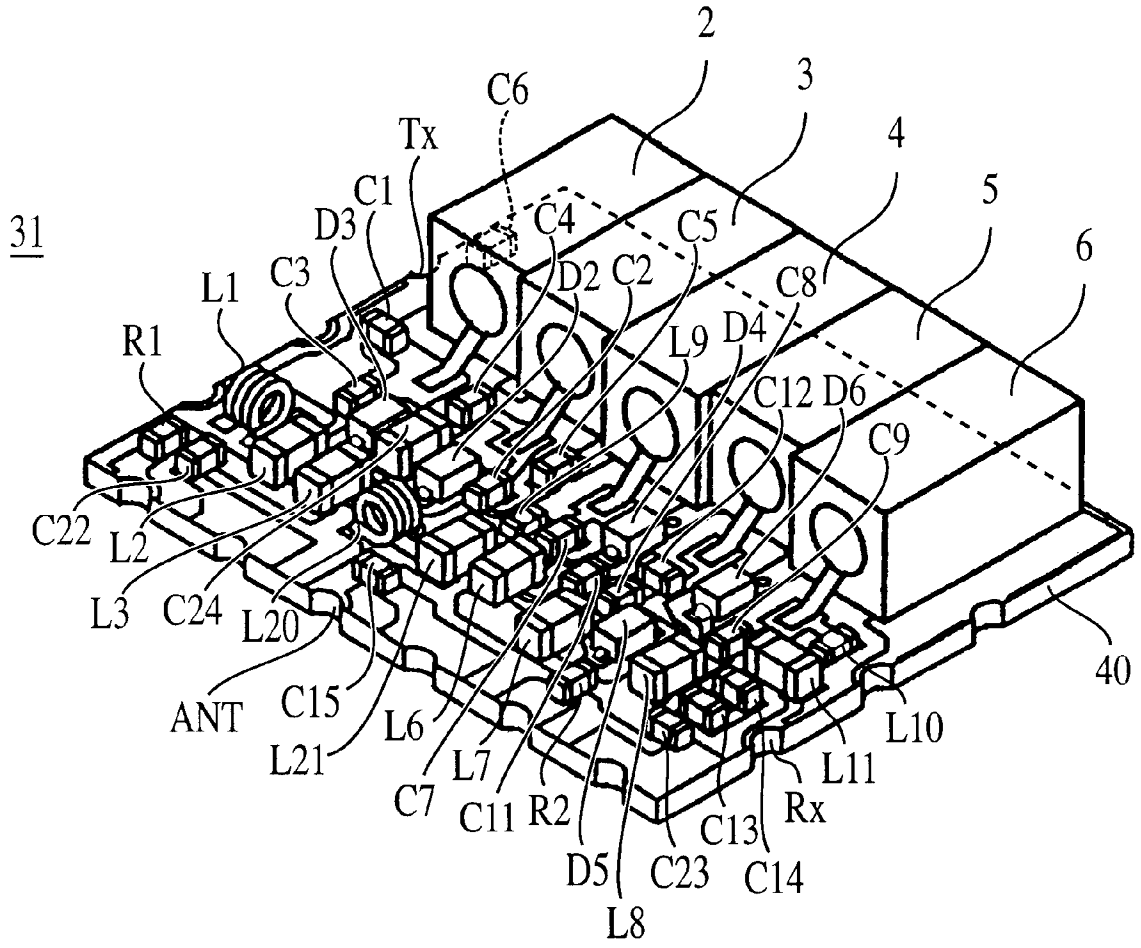
FIG. 2 is a perspective view showing the mounting structure of the duplexer of FIG. 1.

FIG. 1 shows the circuit configuration of a duplexer 31 in a communication apparatus. FIG. 2 is a perspective view of the duplexer 31 in which the respective components are mounted onto a circuit substrate 40. In the duplexer 31, a transmission side circuit 25 is electrically connected between a transmission terminal TX and an antenna terminal ANT, and a reception side circuit 26 between a reception terminal Rx and the antenna terminal ANT.

The transmission side circuit 25 includes a frequency variable band elimination filter circuit 27 and a phase circuit 29. The frequency variable band elimination filter circuit 27 comprises resonant circuits in two stages coupled to each other, that is, it comprises a resonator 2 electrically connected to the transmission side terminal Tx via a resonance capacitor C1, and a resonator 3 electrically connected to the phase circuit 29 via a resonance capacitor C2. The resonance capacitors C1 and C2 are capacitors for determining the rejection-band attenuation. The series resonant circuit comprising the resonator 2 and the resonance capacitor C1 is electrically connected to the series resonant circuit comprising the resonator 3 and the resonance capacitor C2 via a coupling coil L1. Further, capacitors C5 and C6 are electrically connected in parallel to these two series resonant circuits, respectively.

To the intermediate node between the resonator 2 and the resonance capacitor C1, the PIN diode D2 as a reactance element is electrically connected in parallel with the resonator 2 with the cathode being grounded. On the other hand, to the intermediate node between the resonator 3 and the resonance capacitor C2, the PIN diode D3 is electrically connected via a band variable capacitor C4, in parallel with the resonator 3. The band variable capacitors C3 and C4 are capacitors for changing two attenuation extreme frequencies of the attenuation characteristic of the frequency variable band elimination filter circuit 27, respectively. Further, a capacitor 24 is connected in parallel to the band variable capacitor C4.

The phase circuit 29 is a T-shaped type circuit comprising a coil L20 electrically connected between the frequency variable band elimination filter circuit 27 and the antenna terminal ANT, a capacitor 15 electrically connected between the ground and the antenna terminal ANT, and a coil L21 electrically connected between the band-pass filter circuit 28 (described later) of the reception side circuit 26 and the antenna terminal ANT.

On the other hand, the reception side circuit 26 contains the frequency variable band-pass filter circuit 28 and the phase circuit 29. The reception side circuit 26 of the first embodiment shares the phase circuit 29 with the transmission side circuit 25. However, needless to say, the transmission side circuit 25 and the reception side circuit 26 include independent phase circuits, respectively.

The frequency variable band-pass filter circuit 28 comprises a resonant-circuit in three stages coupled to each other, that is, it comprises a resonator 4 electrically connected to the phase circuit 29 via a resonance inductance L9, a resonator 6 electrically connected to the reception terminal Rx via a resonance inductance L10, and a resonator 5 electrically connected between the resonators 4 and 6 via coupling capacitors C11, C12, C13, and C14.

To the intermediate node between the resonator 4 and the resonance inductance L9, a series circuit comprising a band variable capacitor C7 and a PIN diode D4 is electrically connected in parallel with the resonator 4. To the intermediate node among a resonator 5 and the coupling capacitors C12 and C13, a series circuit comprising a band variable capacitor C8 and a PIN diode D5 is electrically connected in parallel with the resonator 5. To the intermediate node between the resonator 6 and the resonance inductance L10, a series circuit comprising a band variable capacitor C9 and a PIN diode D6 is electrically connected in parallel with the resonator 6.

A voltage control terminal CONT1 is electrically connected to the intermediate node between the anode of the PIN diode D2 and the band-variable capacitor C3, via a control voltage supply resistance R1, a capacitor C22, and a choke coil L2. On the other hand, a voltage control terminal CONT2 is electrically connected to the intermediate node between the anode of the PIN diode D3 and the band variable capacitor 4, via a control voltage supply resistor R2, a capacitor C23, and a choke coil L3, is electrically connected to the intermediate node between the anode of the PIN diode D4 and the band variable capacitor C7, via the control voltage supply resistance R2, the capacitor C23, and a choke coil L6, is electrically connected to the intermediate node between the anode of the PIN diode D5 and the band variable capacitor C8, via the control voltage supply resistor R2, the capacitor C23, and a choke coil L7 and further is electrically connected to the intermediate node between the anode of the PIN diode D6 and the band variable capacitor C9, via the control voltage supply resistor R2, the capacitor C23, and a choke coil L8. The capacitors C22 and C23 function as noise-cut bypass capacitors, and are electrically connected among the voltage control terminals CONT1 and CONT2 and the ground, respectively.

Figure 3:
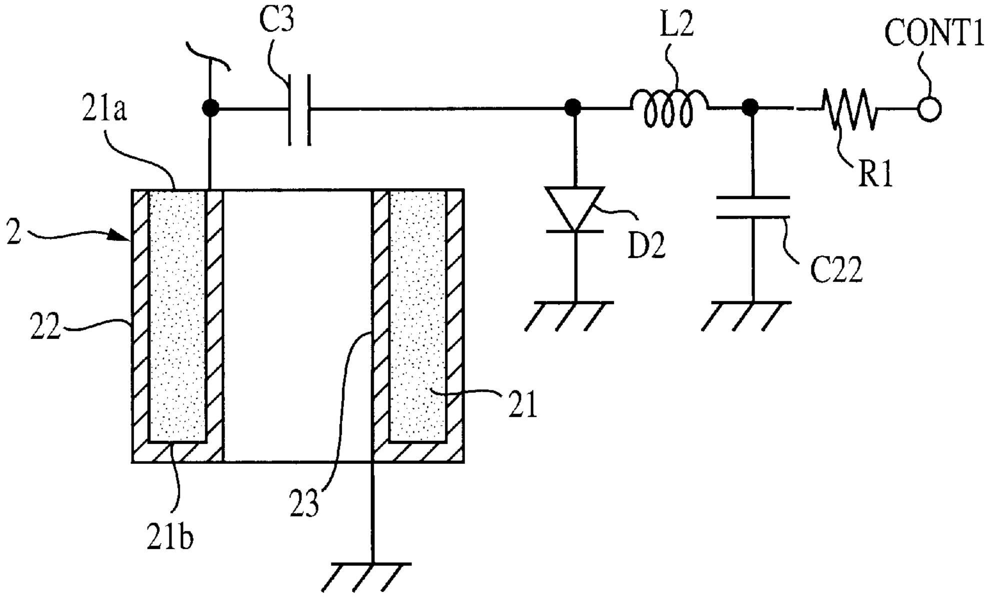
FIG. 3 is a cross sectional view an example of the resonators used in the duplexer of FIG. 1.

Further, for example, dielectric resonators are used as the resonators 2 to 6, as shown in FIG. 3. FIG. 3 shows the resonator 2 as a typical example. The dielectric resonators 2 to 6 each comprise a cylindrical dielectric 21 made of a material with a high dielectric constant such as a $TiO_2$ type ceramic or the like, an outer conductor 22 formed on the outer peripheral surface of the cylindrical dielectric 21, and an inner conductor 23 formed on the inner wall of the cylindrical dielectric 21. The outer conductor 22 is electrically opened (separated) from the inner conductor 23 at one open-end 21*a* (hereinafter, referred to as an open-end face 21*a*) of the dielectric 21, and electrically short-circuited (conducting) to the inner conductor 23 at the other open-end face 21*b* (hereinafter, referred to as a short-circuited end face 21*b*). Regarding the dielectric resonator 2, the series circuit comprising the band variable capacitor C3 and the PIN diode D2 is electrically connected in such a manner that one end of the band variable capacitor C3 is connected to the inner conductor 23 at the open-end face 21*a*, and the cathode of the PIN diode D2 is connected to the ground. The outer conductor 22 is connected to the ground.

Hereinafter, the operation and effects of the duplexer 31 having the above-described configuration will be described. In this duplexer 31, a transmission signal, input to the transmission terminal Tx from a transmission circuit system is output from the antenna terminal ANT via the transmission side circuit 25, while a reception signal input through the antenna terminal ANT is output to a reception circuit system via the reception side circuit 26.

The trap frequency of the frequency variable band elimination filter circuit 27 in the transmission side circuit 25 is determined by the resonance frequency of a resonance system comprising the band variable capacitor C3, the resonance capacitor C1, and the resonator 2, and the resonance frequency of a resonance system comprising the band variable capacitor C4, the resonance capacitor C2, and the resonator 3. When positive voltages as control voltages are applied to the voltage control terminals CONT1 and CONT2, the PIN diodes D2 and D3 are in the on state, respectively. Accordingly, the band variable capacitors C3 and C4 are grounded via the PIN diodes D2 and D3, so that both of the attenuation extreme frequencies are decreased, and the pass-band of the transmission side circuit 25 becomes a LOW channel (1850–1880 MHz).

To the contrary, when the control voltages are 0V with no voltages being applied to the voltage control terminals CONT1 and CONT2, the PIN diodes D2 and D3 are in the off state, respectively. Negative voltages may be applied to the voltage control terminals CONT1 and CONT2, instead of applying the control voltages of 0 V, so that the PIN diodes D2 and D3 are in the off state. Thereby, the band variable capacitors C3 and C4 become open, respectively, so that both of the two attenuation frequencies are increased, and the pass-band of the transmission side circuit 25 becomes a HIGH channel (1880–1910 MHz). Like this, to the transmission side circuit 25, the two different pass-band characteristics can be rendered by carrying out the voltage control to ground or open the band-variable capacitors C3 and C4.

On the other hand, the pass frequency of the frequency variable band-pass filter circuit 28 in the reception side circuit 26 is determined by the resonance frequency of a resonance system comprising the band variable capacitor C7, the resonance inductance L9, and the resonator 4, the resonance frequency of a resonance system comprising the band variable capacitor C8 and the resonator 5, and the resonance frequency of a resonance system comprising the band variable capacitor C9, the resonance inductance L10, and the resonator 6. When positive voltages as control voltages are applied to the voltage control terminal CONT2, the PIN diodes D4, D5, and D6 are in the on state. Accordingly, the band variable capacitors C7, C8, and C9 are grounded via the PIN diodes D4, D5, and D6, respectively, and the pass frequency is decreased, whereby the pass band of the reception side circuit 26 becomes a LOW channel (1930–1960 MHz).

To the contrary, when the control voltage is made 0 V with no voltages being applied to the voltage control terminal CONT2, the PIN diodes D4, D5, and D6 are in the off state. Thereby, the band variable capacitors C7, C8, and C9 become open and the pass frequency is increased, whereby the pass band of the reception side circuit 26 becomes a HIGH channel (1960–1990 MHz). Like this, to the reception side circuit 26, two different pass band characteristics can be rendered by carrying out the voltage control to ground or open the band variable capacitors C7 to C9.

This duplexer 31 is voltage-controlled in such a manner that the two pass bands, namely, the high and low pass bands, are changed over. That is, when the low frequency pass band is selected as a transmission band, the pass frequency of the reception side circuit 26 is decreased, and when the high frequency pass band is selected as the transmission band, the pass frequency of the reception side circuit 26 is increased. Thereby, the phase of the transmission side circuit 25 and that of the reception side circuit 26 can be ideally composed.

Figure 4:
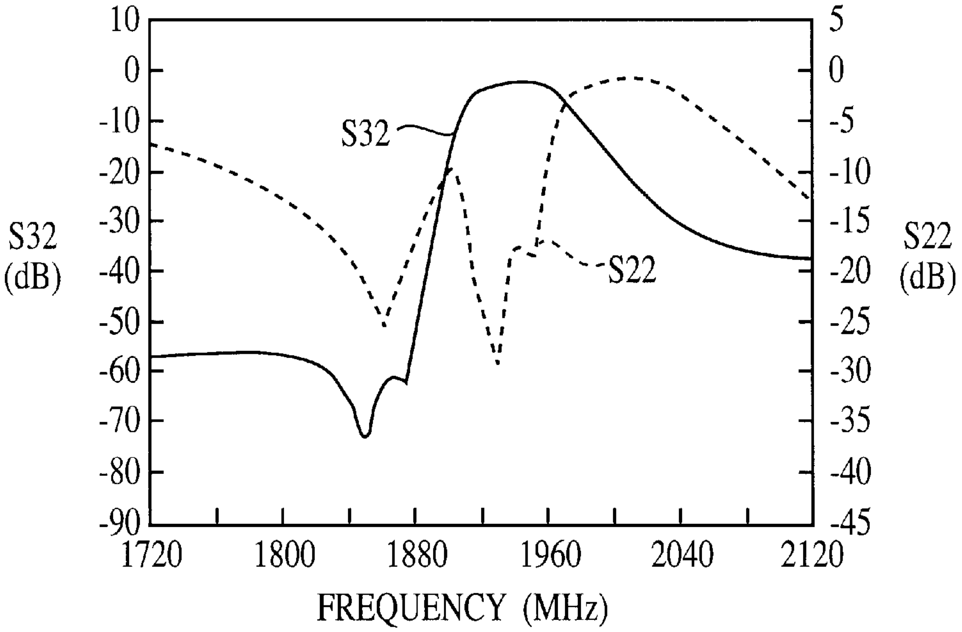
FIG. 4 is a graph showing the pass and reflection characteristics of the reception side circuit of the duplexer of FIG. 1.

If the frequency of a reception wave on standby is 1930 MHz, the duplexer 31 is put into the reception wave standby state, by making the control voltage of the voltage control terminal CONT1 0 V and applying a positive voltage to the voltage control terminal CONT2 only. That is, the PIN diodes D4 to D6 of the reception side circuit 26 and the PIN diode D3 electrically connected to the antenna terminal ANT in the position nearer to the antenna terminal ANT than the PIN diode D2 in the transmission side circuit 25 during the reception wave standby are in the on state. Accordingly, the transmission side circuit 25 is allowed to have a high impedance in the reception frequency band of 1930–1960 MHz, and the insertion loss of the reception side circuit 26 can be suppressed. FIG. 4 is a graph showing the measurement results of the band-pass characteristic S32 and the reflection characteristic S22 (see FIG. 1) of the reception side circuit 26 obtained when a positive voltage is applied to the voltage control terminal CONT2 only. In this case, the insertion loss of the reception side circuit 26 was 3.5 dB. Further, satisfactorily, only the PIN diode D3 is in the on state during the reception wave standby. Both of the PIN diodes D2 and D3 in the transmission side circuit 25 are not in the on state. Thus, the power consumption during the reception wave standby can be suppressed.

Figure 5:
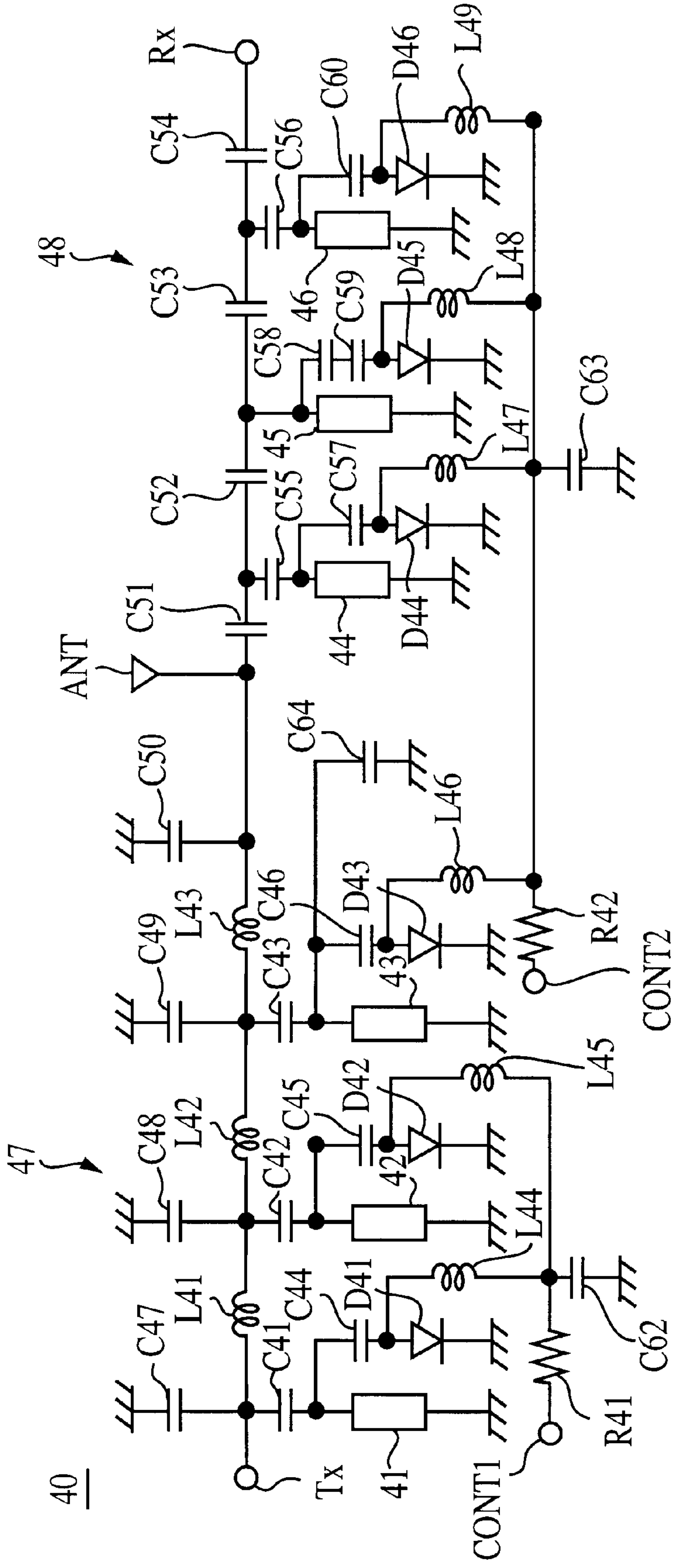
FIG. 5 is an electric circuit diagram of a duplexer according to a second embodiment of the present invention.

Second Embodiment, FIG. 5

FIG. 5 illustrates another embodiment of the duplexer of the present invention. In a duplexer 40, a transmission side circuit 47 is electrically connected between a transmission terminal Tx and an antenna terminal ANT, and a reception side circuit 48 is electrically connected between a reception terminal Rx and the antenna terminal ANT.

The transmission side circuit 47 is a frequency variable band elimination filter having resonant circuits in stages coupled together. A resonator 41 is electrically connected to a transmission terminal Tx via a resonance capacitor C41. A series resonant circuit comprising the resonator 41 and the resonance capacitor C41, a series resonant circuit comprising a resonator 42 and a resonance capacitor C42, and a series resonant circuit comprising a resonator 43 and a resonance capacitor C43 are electrically connected together via coupling coils L41 and L42. Capacitors C47, C48, and C49 are electrically connected in parallel to these three series resonant circuits, respectively. The antenna terminal ANT is electrically connected to the series resonant circuit comprising the resonator 43 and the resonance capacitor C43 via an L-LC circuit comprising a coupling coil L43 and a capacitor 50. The resonance capacitors C41 to C43 are capacitors for determining a rejection-band attenuation.

To the intermediate node between the resonator 41 and the resonance capacitor C41, a PIN diode D41 as a reactance element is electrically connected in parallel with the resonator 41 via band variable capacitor C44, with the cathode being grounded. To the intermediate node between the resonator 42 and the resonance capacitor C42, a PIN diode D42 is electrically connected in parallel with the resonator 43 via a band variable capacitor C45. Further, to the intermediate node between the resonator 43 and the resonance capacitor C43, a PIN diode D43 is electrically connected in parallel with the resonator 43 via a band variable capacitor C46. The band variable capacitors C44 to C46 are capacitors for changing the attenuation extreme frequencies of the transmission side circuit 47. Further, a capacitor 64 is connected in parallel to the band variable capacitor C46.

The reception side circuit 48 is a frequency variable band-pass filter comprising resonant circuits in three stages connected together. A series resonant circuit comprising a resonator 44 and a resonance capacitor C55, a resonator 45, and a series resonant circuit comprising a resonator 46 and a resonance capacitor C56 are electrically connected via coupling capacitors C52 and C53. Further, the series resonant circuit comprising the resonator 44 and the resonance capacitor C55 is electrically connected to the antenna terminal ANT via a coupling capacitor C51. The series resonant circuit comprising the resonator 46 and the resonance capacitor C56 is electrically connected to the reception terminal Rx via a coupling capacitor C54.

To the intermediate node between the resonator 44 and the resonance capacitor C55, a series circuit comprising a band variable capacitor C57 and a PIN diode D44 is electrically connected in parallel with the resonator 44. To the intermediate node among the resonator 45 and the coupling capacitors C52 and C53, a series circuit comprising a band variable capacitors C58 and C59, and the PIN diode D45 is electrically connected in parallel with the resonator 45. To the intermediate node between the resonator 46 and the resonance capacitor C56, a series circuit comprising a band variable capacitor C60 and a PIN diode D46 is electrically connected in parallel with the resonator 46.

A voltage control terminal CONT1 is electrically connected to the intermediate node between the anode of the PIN diode D41 and the band variable capacitor C44 via a control voltage supply resistor R41, a capacitor C62, and a choke coil L44, and is electrically connected to the intermediate node between the anode of the PIN diode D42 and the band variable capacitor C45 via the control voltage supply resistor R41, the capacitor C62, and a choke coil L45.

On the other hand, a voltage control terminal CONT2 is electrically connected to the intermediate node between the anode of the PIN diode D43 and the band variable capacitor C46 via a control voltage supply resistor R42, a capacitor C63, and a choke coil L46, electrically connected to the intermediate node between the anode of the PIN diode D44 and the band variable capacitor C57 via the control voltage supply resistor R42, the capacitor C63, and a choke coil 47, and moreover, electrically connected to the intermediate node between the anode of the PIN diode D46 and the band variable capacitor C60 via the control voltage supply resistor R42, the capacitor C63, and a choke coil L49.

The duplexer 40 having the above-described configuration has the same operation and effects as those of the duplexer 31 of the first embodiment.

Figure 6:
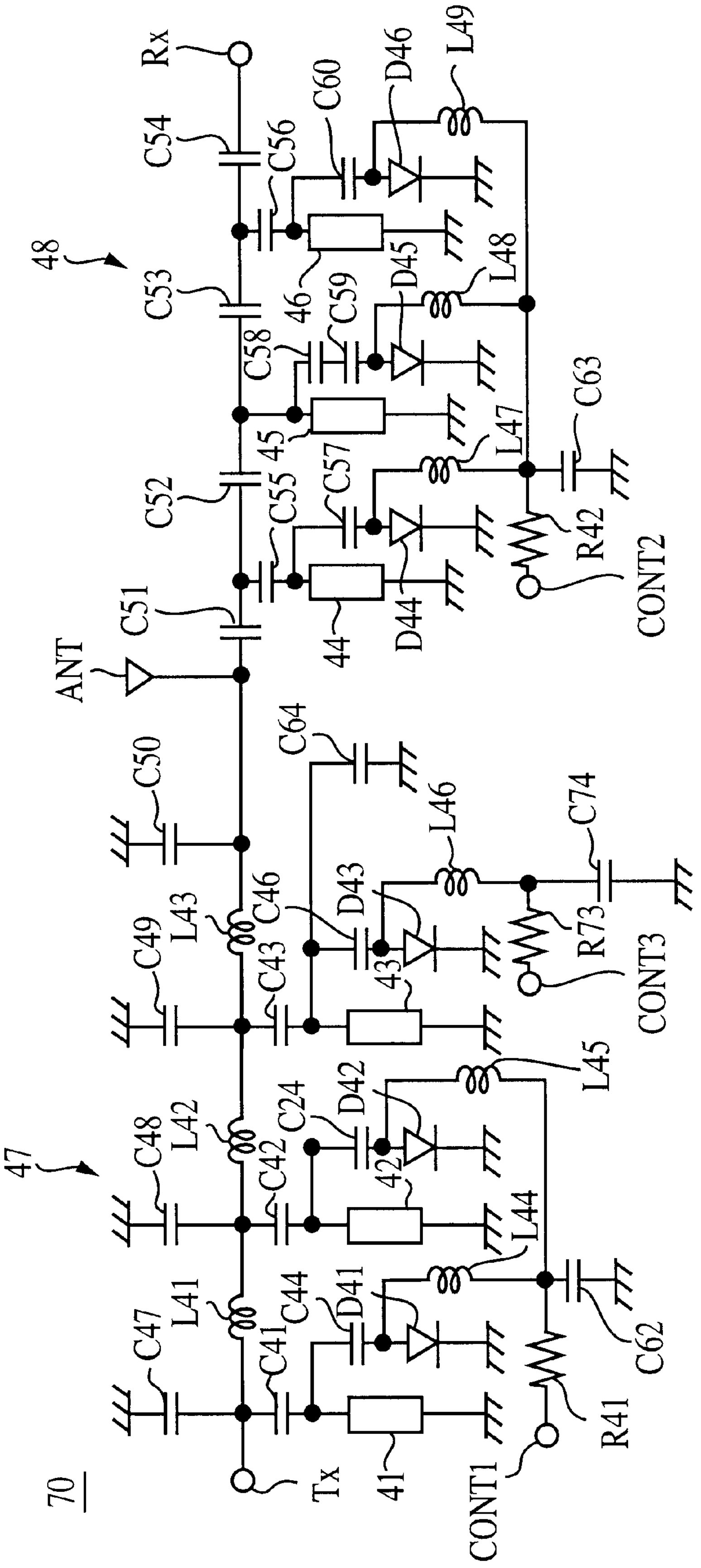
FIG. 6 is an electric circuit diagram of a duplexer of the present invention.

Third Embodiment, FIG. 6

FIG. 6 shows a duplexer according to a third embodiment of the present invention. A duplexer 70 is the same as the duplexer 40 of the second embodiment except that a voltage control terminal CONT3 for independently voltage-controlling the PIN diode D43, connected to the resonator 43 which is electrically connected to the antenna terminal ANT in the position nearest thereto in the transmission side circuit 47 is newly provided. The voltage control terminal CONT3 is connected to the intermediate node between the anode of the PIN diode D43 and the band variable capacitor C46 via a control voltage supply resistorR73, a capacitor C74, and a choke coil L46.

Hereinafter, the operation and effects of the duplexer 70 having the above-described configuration will be described.

Figure 12:
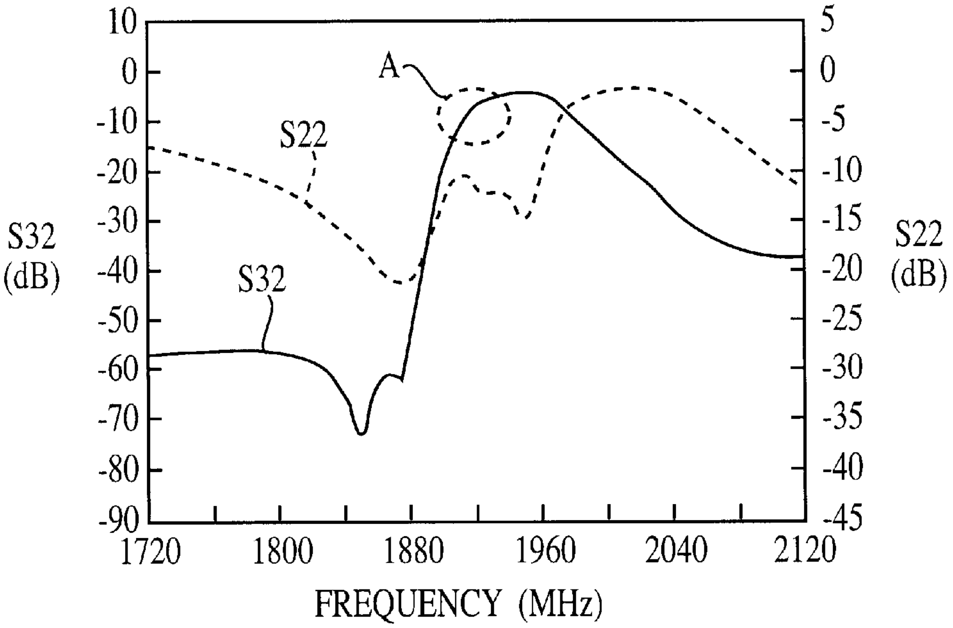
FIG. 12 PRIOR ART
FIG. 12 is a graph showing the pass and reflection characteristics of a reception side circuit of a prior art duplexer when a positive voltage is applied to a voltage control terminal CONT2 only.

As described previously, if consumption current is caused to flow through the reception side circuit 48 only of the duplexer 70 during reception wave standby, the insertion loss of the respectively side circuit 48 is increased. However, as seen in the pass characteristic S32 of FIG. 12, the insertion loss of the reception side circuit 47 is deteriorated at about 1930 MHz only, which is near to the transmission frequency band (1850–1910 MHz), while substantially no deterioration of the insertion loss occurs near to 1960 MHz.

Accordingly, in the case where frequencies near to 1960 MHz are used as the frequency of a reception wave on standby, the control voltages of the voltage control terminals CONT1 and CONT3 are made 0V and a positive voltage is applied to the voltage control terminal CONT2 only. That is, a consumption current is made to flow through the reception side circuit 48 only during reception wave standby.

On the other hand, in the case where about 1930 MHz is used as the frequency of a reception wave on standby, the control voltage of the voltage control terminal CONT1 is made 0V, and positive voltages are applied to the voltage control terminals CONT2 and CONT3. That is, during the reception wave standby, the PIN diodes D44 to D46, and the PIN diode D43 electrically connected in the position nearest to the antenna terminal ANT among the PIN diodes D41 to D43 in the transmission side circuit 47 are in the on state.

Like this, appropriate control voltages are applied to the voltage control terminals CONT1 to CONT3, depending on whether the frequency of a reception wave on standby is near to 1960 MHz or 1930 MHz, so that the power consumption can be further decreased.

Figure 7:
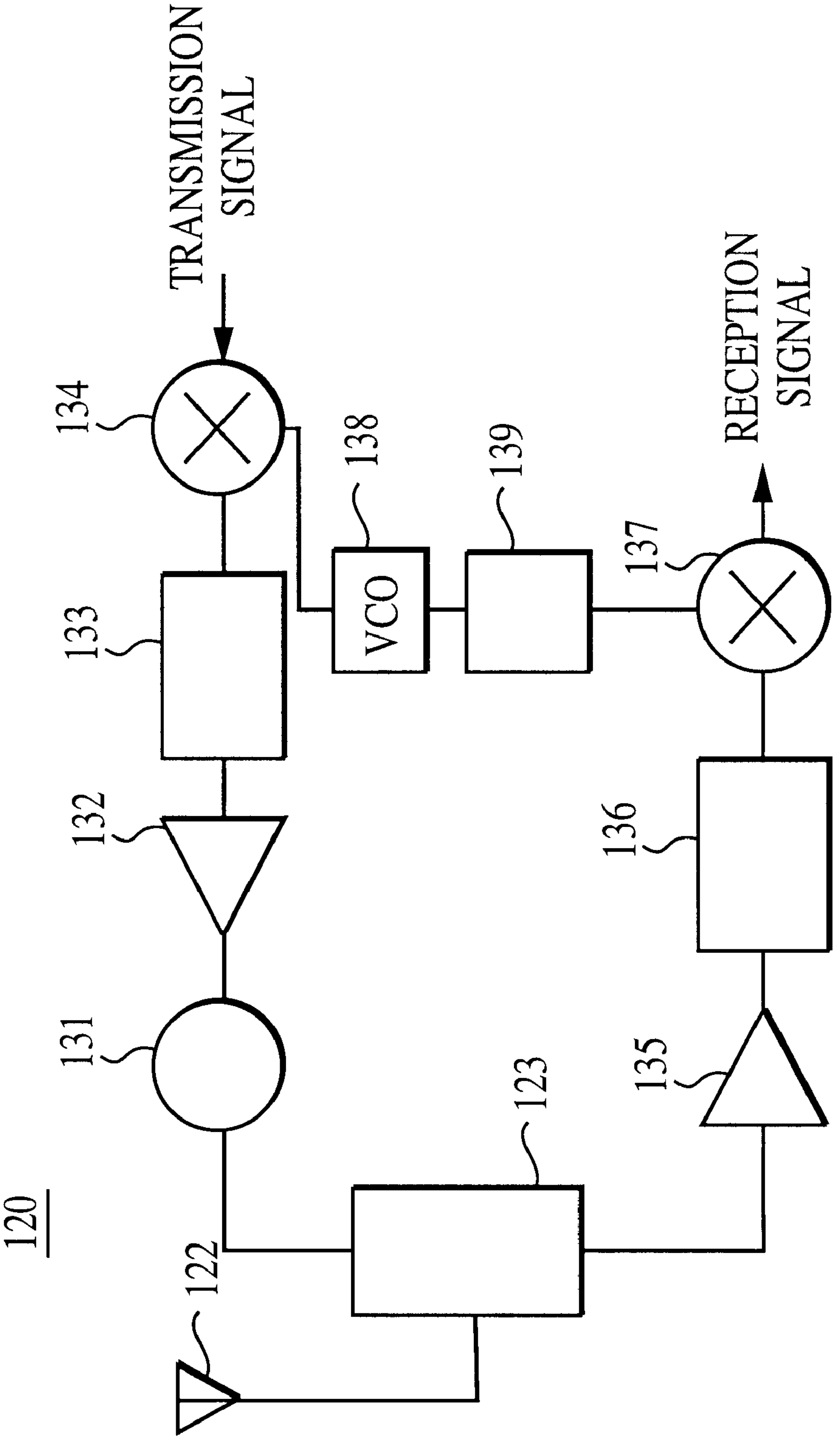
FIG. 7 is a block diagram of a communication apparatus according to an embodiment of the present invention.
Figure 8:
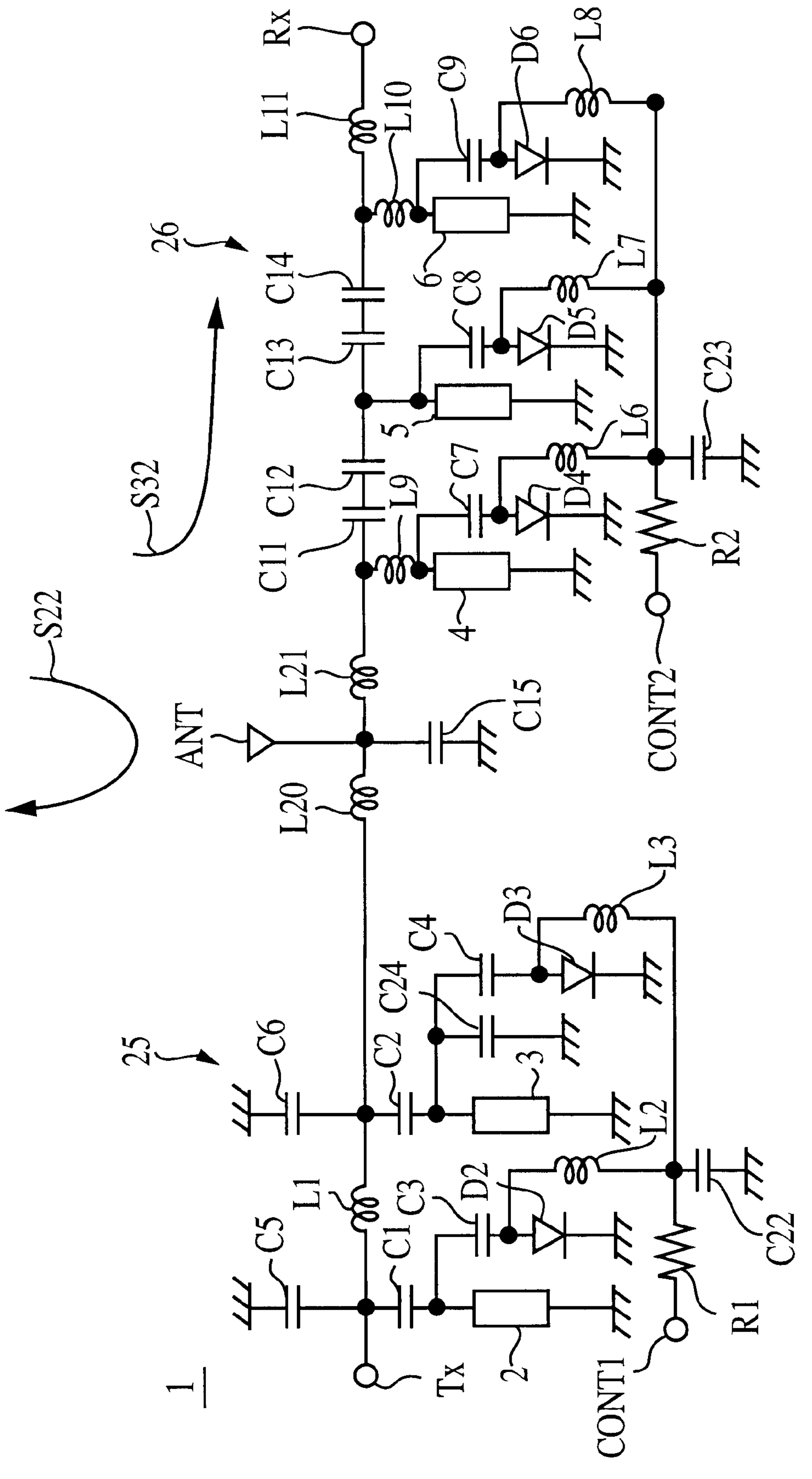
FIG. 8 PRIOR ART
FIG. 8 is an electric circuit diagram showing the constitution of a prior art antenna device.
Figure 9:
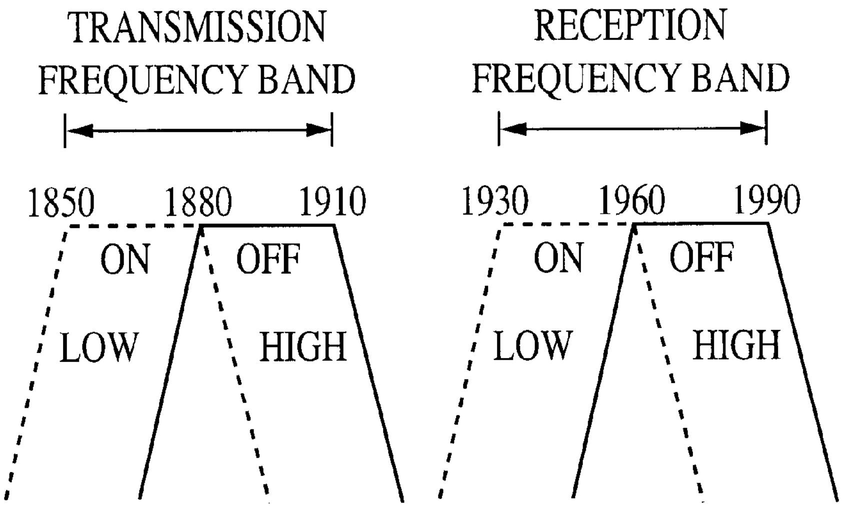
FIG. 9 PRIOR ART
FIG. 9 is an illustration of the filter characteristic of a duplexer.
Figure 10:
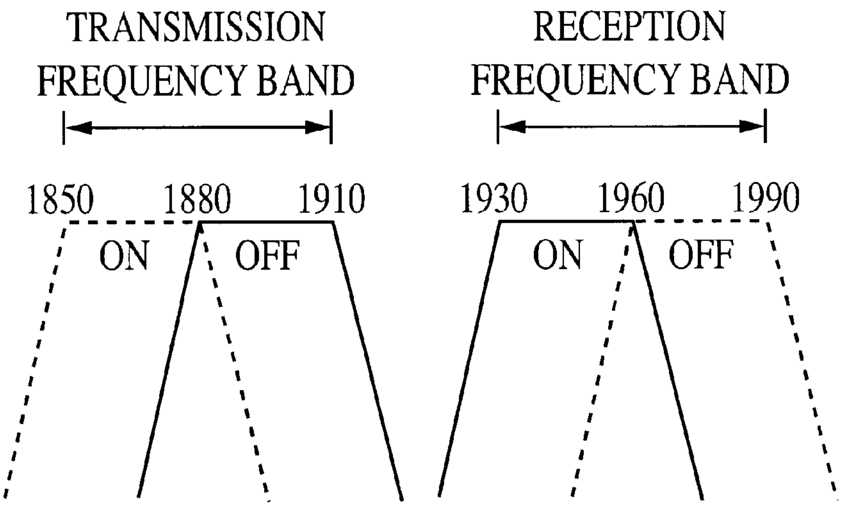
FIG. 10 PRIOR ART
FIG. 10 is an illustration of the filter characteristic of a prior art duplexer.
Figure 11:
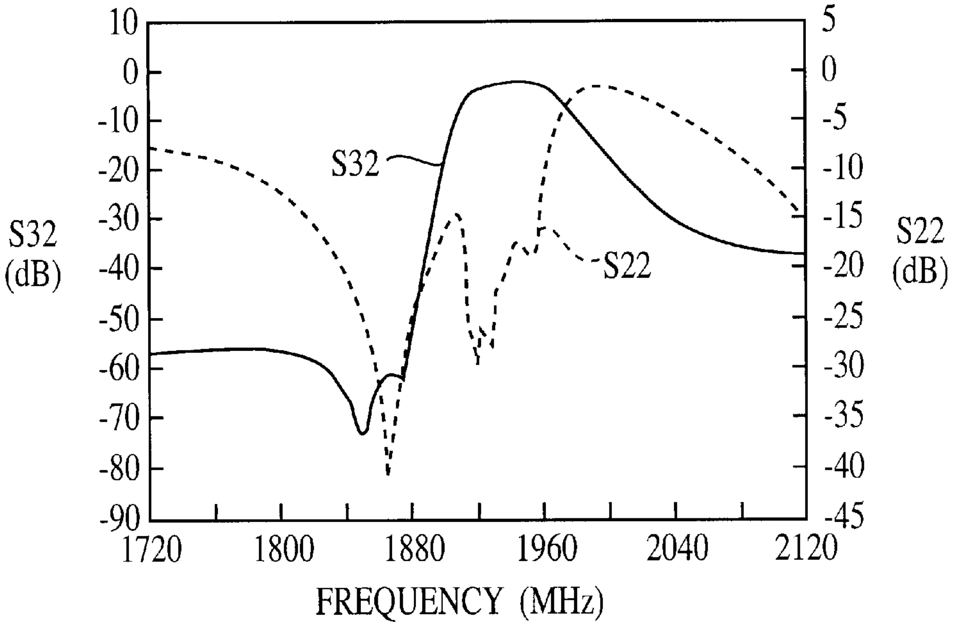
FIG. 11 PRIOR ART
FIG. 11 is a graph showing the pass and reflection characteristics of the reception side circuit of a prior art duplexer when positive voltages are applied to voltage control terminals CONT1 and CONT2.

Fourth Embodiment, FIG. 7

The fourth embodiment will be described with reference to a portable telephone as an example of the communication apparatus of the present invention.

FIG. 7 is an electric circuit block diagram of the RF part of a portable telephone 120. In FIG. 7, an antenna element is designated by 122, a duplexer by 123, a transmission side isolator by 131, a transmission side amplifier by 135, a reception side interstage band-pass filter by 136, a reception side mixer by 137, a voltage control oscillator (VCO) by 138, and a local band-pass filter by 139.

As the duplexer 123, the duplexers 31, 40, and 70 of the first to third embodiments may be used. A portable telephone with a low power consumption and a low loss of the reception side circuit during reception wave standby can be realized by mounting the duplexer 31, 40, or 70.

The duplexer and the communication apparatus of the present invention are limited onto the above-described embodiments, and variations may be made without departing from the sprit and the scope of the present invention. Especially, as the reactance element, variable capacitance diodes, transistors or the like are available in addition to the PIN diode. Further, as the resonators, strip line resonators or the like may be employed, in addition to the dielectric resonators.

While the invention has been particularly shown and described with reference to preferred embodiments thereof, it will be understood by those skilled in the art that the forgoing and other changes in form and details may be made therein without departing from the spirit of the invention.

What is claimed is:

1. A duplexer comprising:

a first external terminal;

a second external terminal;

an antenna terminal;

a first frequency variable filter electrically connected between the first external terminal and the antenna terminal, and composed of at least two resonators and reactance elements electrically connected to respective ones of the resonators and capable of being voltage-controlled;

a second frequency variable filter electrically connected between the second external terminal and the antenna terminal, and composed of at least one resonator and a reactance element electrically connected to the resonator and capable of being voltage-controlled;

a predetermined reactance element of the first frequency variable filter being in an on state and another reactance element of the first frequency variable filter being in an off state, when the reactance element of the second frequency variable filter is in an on state, said predetermined reactance element of the first frequency variable filter being a reactance element connected to the resonator electrically connected in a position nearest to the antenna terminal.

2. A duplexer according to claim 1, wherein the first frequency variable filter is a transmission filter, and the second frequency variable filter is a reception filter.

3. A duplexer according to one of claims 1 and 2, further comprising a first voltage control terminal for voltage-controlling a reactance element other than the predetermined reactance element of the first frequency variable filter; and a second voltage control terminal for voltage-controlling the reactance element of the second frequency variable filter and the predetermined reactance element of the first frequency variable filter.

4. A duplexer according to one of claims 1 and 2, further comprising a first voltage control terminal for voltage-controlling a reactance element other than the predetermined reactance element of the first frequency variable filter;

a second voltage control terminal for voltage-controlling the predetermined reactance element of the first frequency variable filter, and a third voltage control terminal for voltage-controlling a reactance element of the second frequency variable filter.

5. A duplexer according to one of claims 1 and 2, wherein each said reactance element is a PIN diode.

6. A duplexer according to one of claims 1 and 2, wherein the resonators of the first and second frequency variable filters are dielectric resonators.

7. A communication apparatus comprising:

a transmitting circuit and a receiving circuit;

a duplexer comprising:

a first external terminal;

an antenna terminal;

a first frequency variable filter electrically connected between the first external terminal, and the antenna terminal, and composed of at least two resonators and reactance elements electrically connected to respective ones of the resonators and capable of being voltage-controlled;

a second frequency variable filter electrically connected between the second external terminal and the antenna terminal, and composed of at least one resonator and a reactance element electrically connected to the resonator and capable of being voltage-controlled;

a predetermined reactance element of the first frequency variable filter being in an on state and another reactance element of the first frequency variable filter being in an off state, when the reactance element of the second frequency variable filter is in an on state;

said predetermined reactance element of the first frequency variable filter being a reactance element connected to the resonator electrically connected in a position nearest to the antenna terminal;

the transmitting circuit being connected to the first external terminal and the receiving circuit being connected to the second external terminal.

8. A communication apparatus according to claim 7, further comprising an antenna connected to said antenna terminal.

* * * * *